US010615057B1

(12) United States Patent
Chorosinski et al.

(10) Patent No.: US 10,615,057 B1
(45) Date of Patent: Apr. 7, 2020

(54) ENCAPSULATION PROCESS FOR SEMICONDUCTOR DEVICES

(71) Applicant: NORTHROP GRUMMAN SYSTEMS CORPORATION, Falls Church, VA (US)

(72) Inventors: Leonard George Chorosinski, Ellicott City, MD (US); Parrish E. Ralston, Baltimore, MD (US); Venkatesh V. Sundaram, Johns Creek, GA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/216,619

(22) Filed: Dec. 11, 2018

(51) Int. Cl.
H01L 21/56 (2006.01)
H01L 23/544 (2006.01)
H01L 21/683 (2006.01)
H01L 21/304 (2006.01)
H01L 21/78 (2006.01)
H01L 21/66 (2006.01)
H01L 21/48 (2006.01)

(52) U.S. Cl.
CPC .......... H01L 21/568 (2013.01); H01L 21/304 (2013.01); H01L 21/4825 (2013.01); H01L 21/561 (2013.01); H01L 21/6836 (2013.01); H01L 21/78 (2013.01); H01L 22/12 (2013.01); H01L 23/544 (2013.01); H01L 2221/68336 (2013.01); H01L 2221/68381 (2013.01); H01L 2223/5446 (2013.01)

(58) Field of Classification Search
CPC ..... H01L 21/302; H01L 21/304; H01L 21/56; H01L 21/561; H01L 21/568; H01L 21/6836; H01L 21/78
See application file for complete search history.

(56) References Cited

U.S. PATENT DOCUMENTS 6,451,671 B1 9/2002 Yamada
7,276,783 B2 10/2007 Goller et al.
9,412,663 B1 8/2016 Andry et al.
2018/0301353 A1* 10/2018 de Witte ............. H01L 21/4825

FOREIGN PATENT DOCUMENTS

WO 94/25987 11/1994

* cited by examiner

Primary Examiner — Hoai V Pham
(74) Attorney, Agent, or Firm — Tarolli, Sundheim, Covell & Tummino LLP

(57) ABSTRACT

A method of encapsulating integrated circuits is disclosed. The method includes placing a front side of a semiconductor wafer, having partially cut scribe lines that separate a plurality of semiconductor dies, onto a backside of a dicing tape, grinding a backside of the cut semiconductor wafer to singulate the plurality of semiconductor dies, exposing the backside of the dicing tape to ultraviolet (UV) light to soften the dicing tape between each of the plurality of semiconductor dies and stretching the dicing tape to increase a distance between the plurality of semiconductor dies, laminating a backside and sides of each of the plurality of semiconductor dies with a first layer of encapsulant material, exposing a front side of the dicing tape to UV light to release the dicing tape from the plurality of semiconductor dies, and laminating a front side of the semiconductor dies with a second layer of encapsulant material.

20 Claims, 13 Drawing Sheets

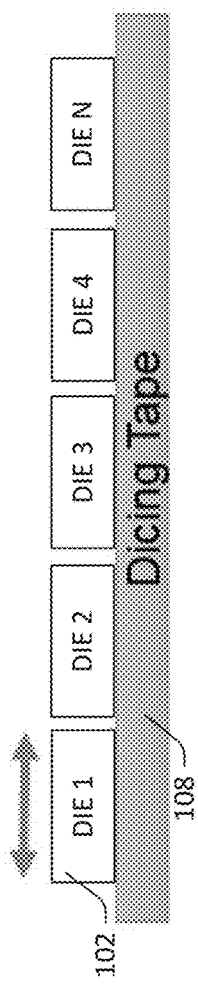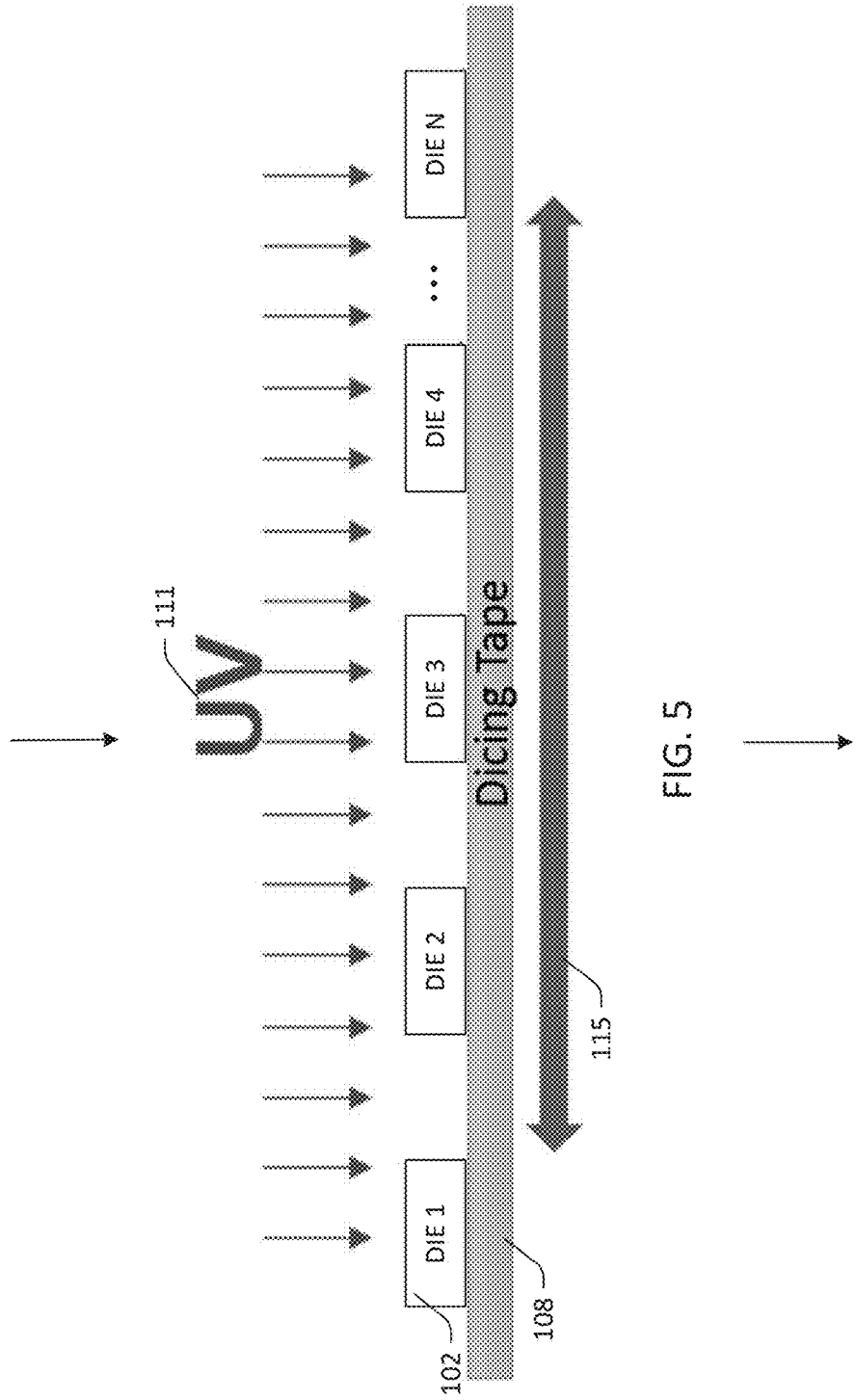

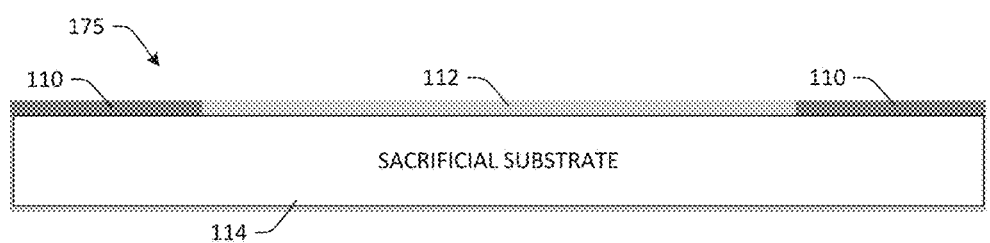
FIG. 7
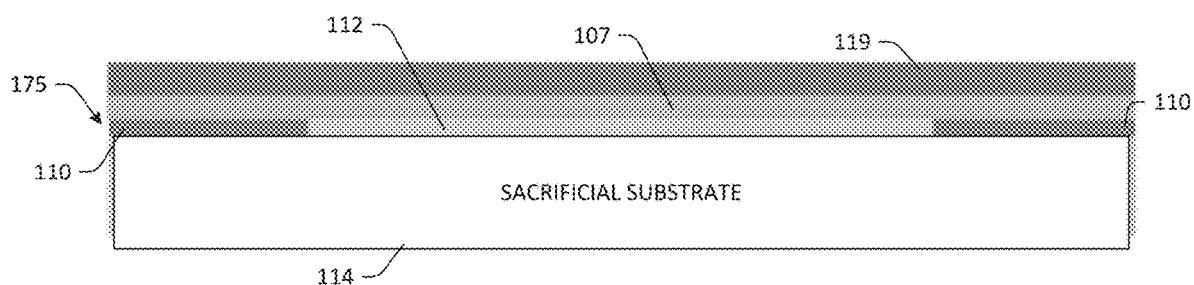
FIG. 8

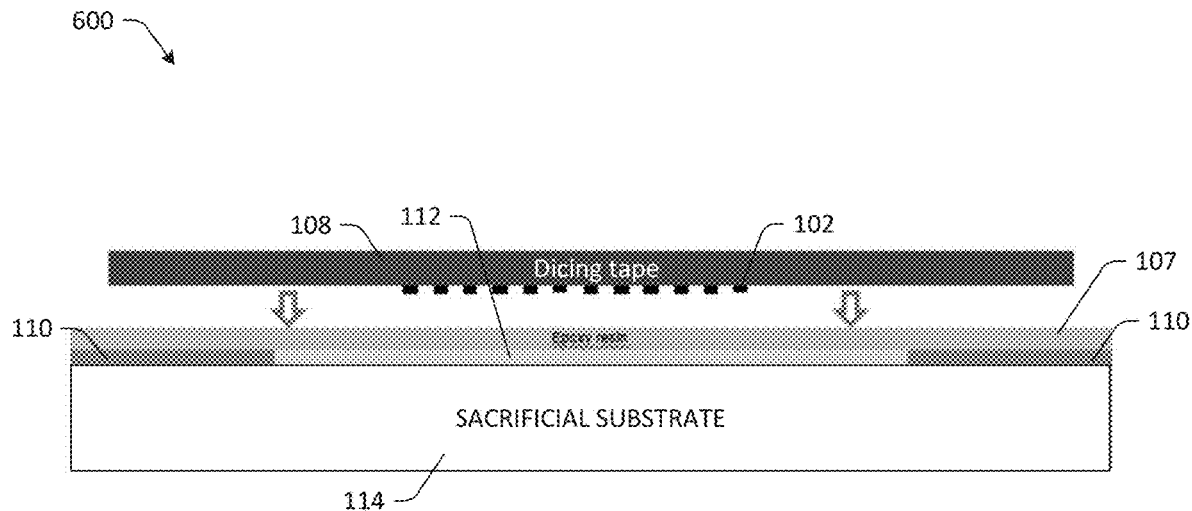
FIG. 11
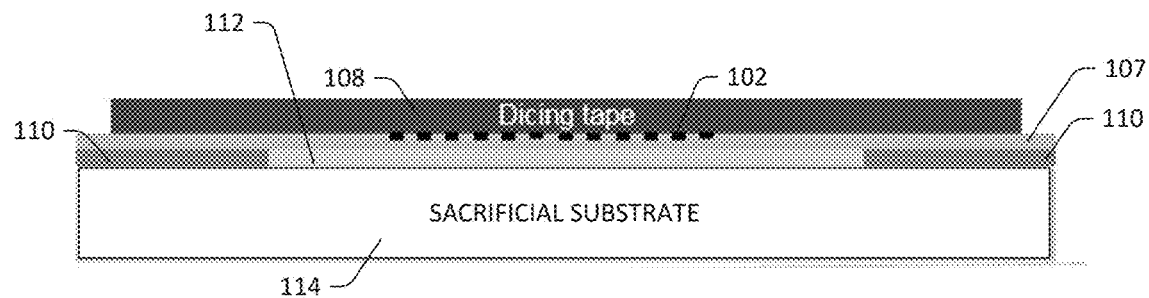
FIG. 12

ENCAPSULATION PROCESS FOR SEMICONDUCTOR DEVICES

GOVERNMENT INTEREST

The invention was made under Government Contract Number HR011-15-C-0003. Therefore, the US Government has rights to the invention as specified in that contract.

TECHNICAL FIELD

This relates to semiconductor processing, or more particularly to an encapsulation process for semiconductor devices.

BACKGROUND

Semiconductor device chips, including integrated circuit silicon die may become damaged during assembly, packaging, and operation through various means. For example, moisture may penetrate the die, films may crack, and other types of mechanical and chemical damage may occur. This is especially true for ultra-small and ultra-thin die. Moreover, the conductive and passivation layers on the ultra-small die are subject to impairment or destruction during handling and packaging processes, resulting in corruption of the die.

SUMMARY

In one example, a method of encapsulating integrated circuits is disclosed. The method includes placing a front side of a semiconductor wafer, having partially cut scribe lines that separate a plurality of semiconductor dies, onto a backside of a dicing tape, grinding a backside of the cut semiconductor wafer to singulate the plurality of semiconductor dies, exposing the backside of the dicing tape to ultraviolet (UV) light to soften the dicing tape between each of the plurality of semiconductor dies and stretching the dicing tape to increase a distance between the plurality of semiconductor dies, laminating a backside and sides of each of the plurality of semiconductor dies with a first layer of encapsulant material, exposing a front side of the dicing tape to UV light to release the dicing tape from the plurality of semiconductor dies, and laminating a front side of the semiconductor dies with a second layer of encapsulant material.

In another example, a method of encapsulating integrated circuits is disclosed. The method includes providing a sacrificial substrate to support a layer of a dicing tape having a plurality of semiconductor dies on a backside of the dicing tape, applying an anti-adhesion layer to a portion of the sacrificial substrate to prevent the semiconductor dies from adhering to the sacrificial substrate, adding material to areas of the sacrificial substrate where the anti-adhesion layer was not applied to create a planar surface, exposing the backside of the dicing tape to ultraviolet (UV) light to soften the dicing tape between each of the plurality of semiconductor dies, and stretching the dicing tape to increase a distance between the plurality of semiconductor dies, applying a first layer of encapsulant material to the planar surface, placing the backside of the dicing tape having the plurality of semiconductor dies onto the first layer of encapsulant material such that backsides and sides of the semiconductor dies are embedded into the first layer of encapsulant material, exposing a front side of the dicing tape to ultraviolet light to release the dicing tape from the plurality of semiconductor dies, and applying a second layer of encapsulant material onto front sides of the semiconductor dies to encapsulate the semiconductor dies between the first layer of encapsulant material and the second layer of encapsulant material.

BRIEF DESCRIPTION OF THE DRAWINGS

FIG. 4 depicts the diced and singulated semiconductor dies placed onto dicing tape.

FIG. 5 depicts an example application of ultraviolet (UV) light to the dicing tape.

FIG. 7 shows an example planar surface used for the encapsulation process.

FIG. 8 shows a first layer of encapsulant material being applied to the planar surface via a first film layer.

FIG. 11 depicts placement of the dicing tape having the plurality of semiconductor dies onto the first layer of encapsulant material.

FIG. 12 depicts laminating a backside and sides of each of the plurality of semiconductor dies with the first layer of encapsulant material.

DETAILED DESCRIPTION

Figure 1:
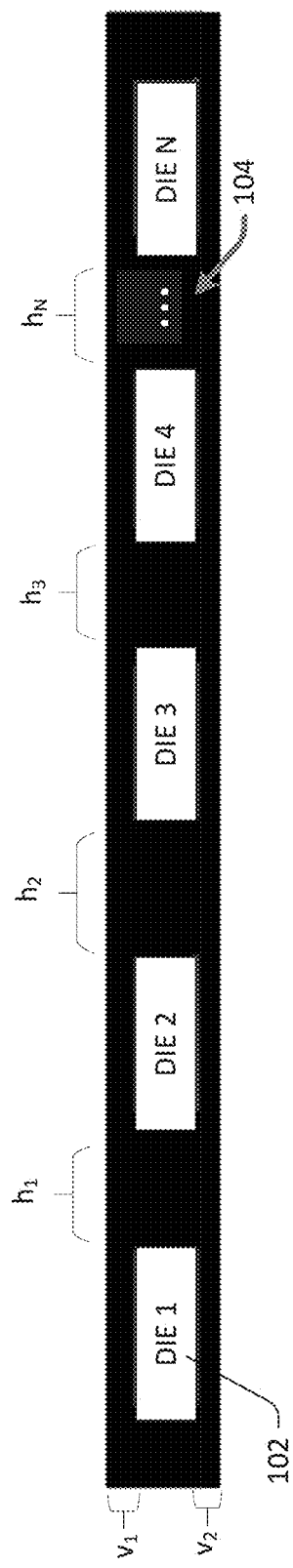
FIG. 1 depicts an example encapsulation of a plurality of semiconductor dies within an encapsulant material.

Disclosed herein is an encapsulation process to provide protection to small integrated circuits against damage that may occur if handled as a bare die by standard equipment.

The process gives an increased footprint allowing standard equipment to handle ultra-small (e.g., less than 500 μm) and ultrathin (e.g., less than 50 μm) semiconductor dies. Ultra-small semiconductor dies in some contexts and examples are also referred to and known as "dielets". Accordingly, disclosed herein is an encapsulation process that laminates both sides of a small semiconductor die and can be scaled to a wafer scale process.

The process begins by adding thin films onto each semiconductor wafer. The wafers are then probed and programmed to develop a map of the semiconductor dies. Scribe lines are then partially cut into the wafers for the semiconductor dies (e.g., 100 μm semiconductor dies). Dicing tape is then applied to the front side of the wafer and the backside of the wafers are thinned to their final thickness to singulate the semiconductor dies (e.g., to 100 μm wafer). The exposed semiconductor die side is then exposed to ultraviolet (UV) light to soften the exposed tape while the tape underneath the semiconductor dies is shielded from the UV light and, thus, not softened. The dicing tape is then stretched to expand the wafer to increase the effective footprint of each semiconductor die. The UV exposure and stretching steps can be completed multiple times until the semiconductor dies are the desired distance apart. Moreover, to ensure the integrity of the dicing tape, the dicing tape can be replaced at some point between the multiple UV exposure and stretching steps.

Once the semiconductor dies have been stretched to the desired distance, the semiconductor dies are placed into a vacuum. An encapsulant material layer is laminated over a planar anti-adhesion layer created on a substrate or sacrificial substrate. The terms "encapsulant" and "encapsulant material" are used interchangeably herein. In some examples, the encapsulant material is either epoxy resin, a B-staged reflowable polymer adhesive or a thermoplastic. In some examples, the anti-adhesion layer is polytetrafluoroethylene. In some examples, the substrate or sacrificial substrate is FR4 or a glass-reinforced epoxy laminate material, while in other examples, the substrate or sacrificial substrate is a metal plate. In certain examples, other materials could also be used for the encapsulant material, the anti-adhesion layer, or the substrate/sacrificial substrate or for materials related to other aspects of the methods disclosed herein.

The semiconductor dies go through an oxygen plasma treatment to remove the adhesive polymer from the exposed portions of the dicing tape. The exposed side of the semiconductor dies is then encapsulated in the encapsulant material. The backside of the semiconductor dies, which is covered by the dicing tape, is exposed to UV light and the dicing tape is removed. The remainder of the semiconductor die is then encapsulated in the encapsulant material. The encapsulated semiconductor dies are placed into an oven to cure the encapsulant material (e.g., at about 160° C. for about one hour). The cured encapsulated semiconductor dies are then cut from the cured encapsulant material sheet and singulated into the final dimensions (e.g., 200 μm×200 μm). The singulated encapsulated plurality of semiconductor dies are transferred to tape-and-reel using bulk feeders and chip shooters. The singulated encapsulated semiconductor dies are tested and the bad semiconductor dies are removed.

Figure 19:
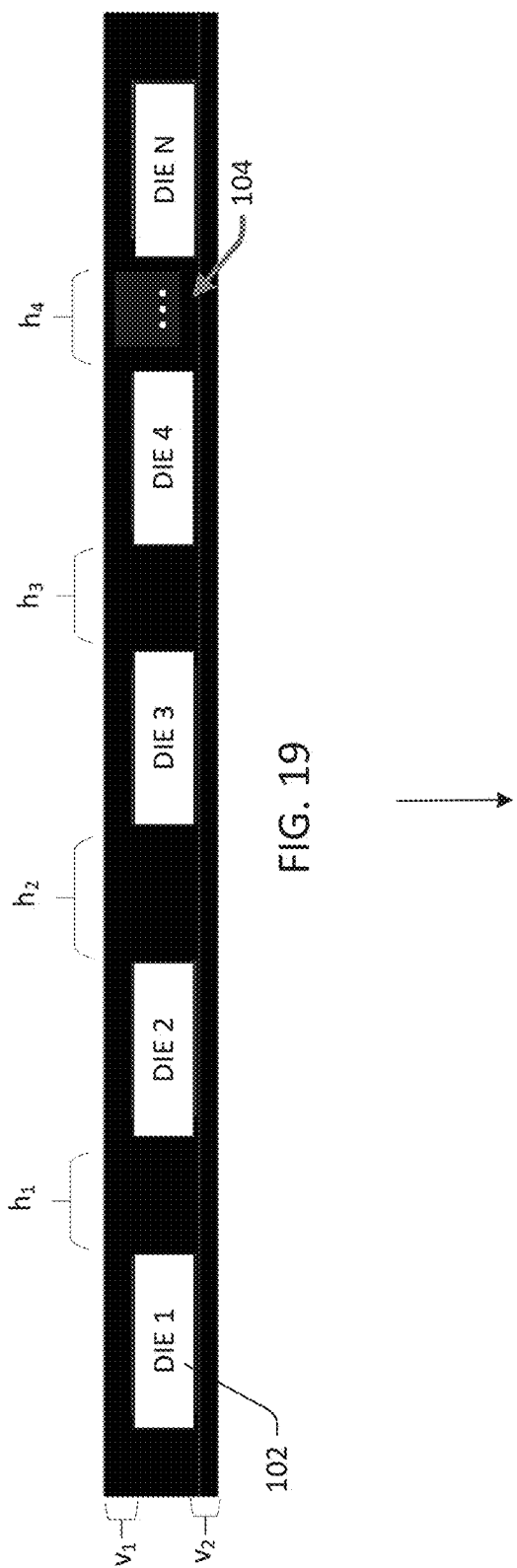
FIG. 19 depicts the cut out cured sheet of semiconductor dies that have been encapsulated into the encapsulant material.
Figure 20:
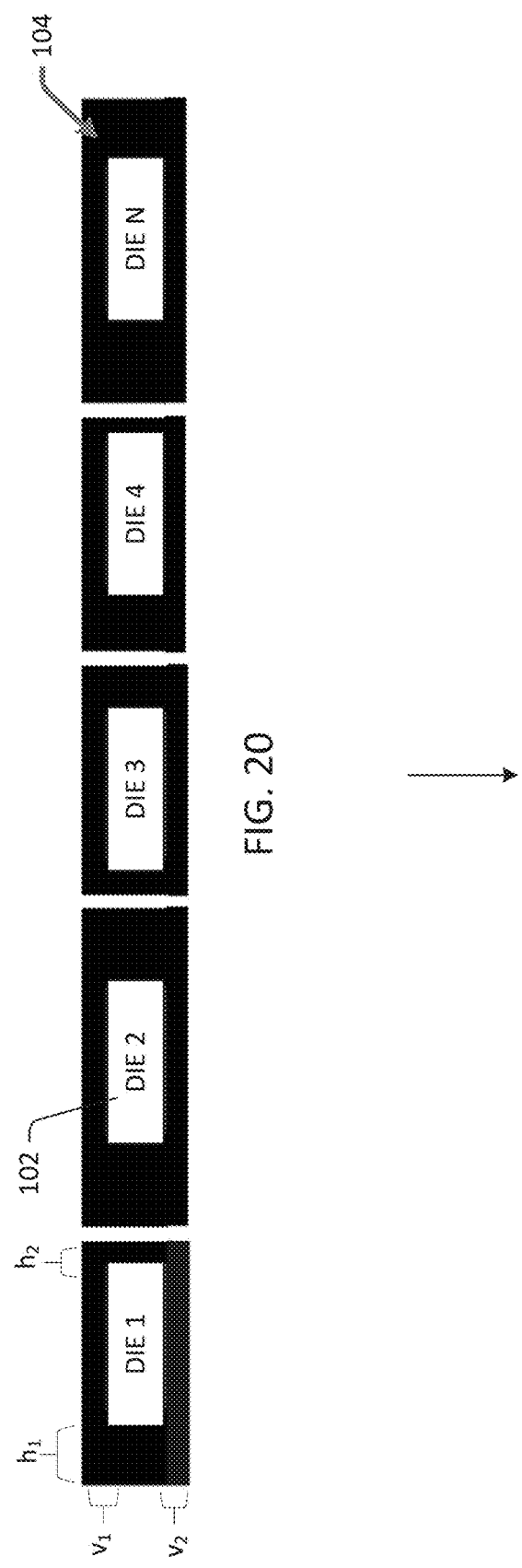
FIG. 20 depicts the encapsulated semiconductor dies after the semiconductor dies have been singulated.
Figure 21:
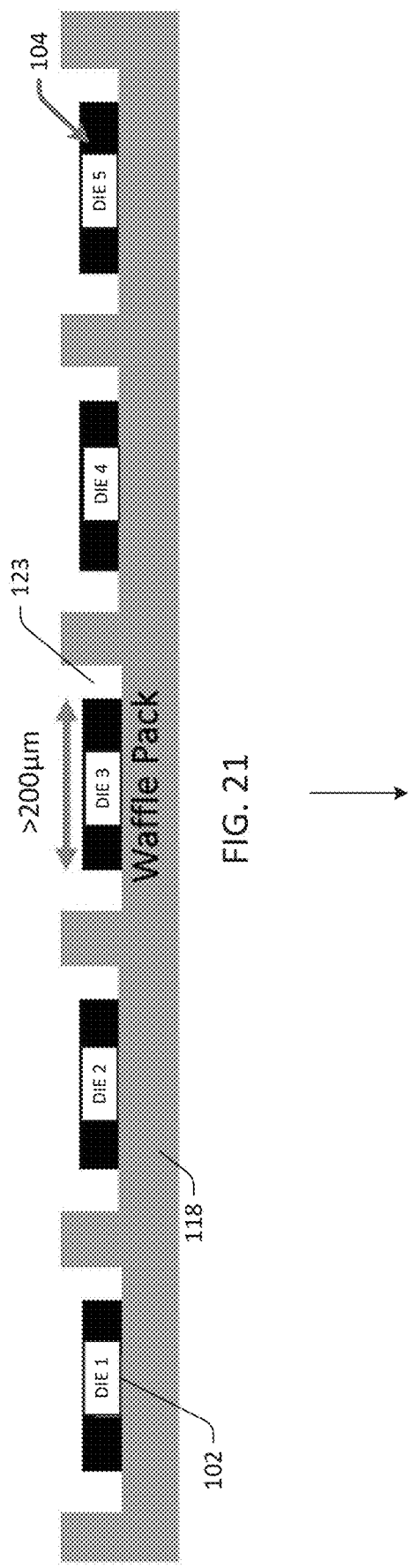
FIG. 21 depicts the singulated encapsulated semiconductor dies placed onto a waffle pack.
Figure 22:
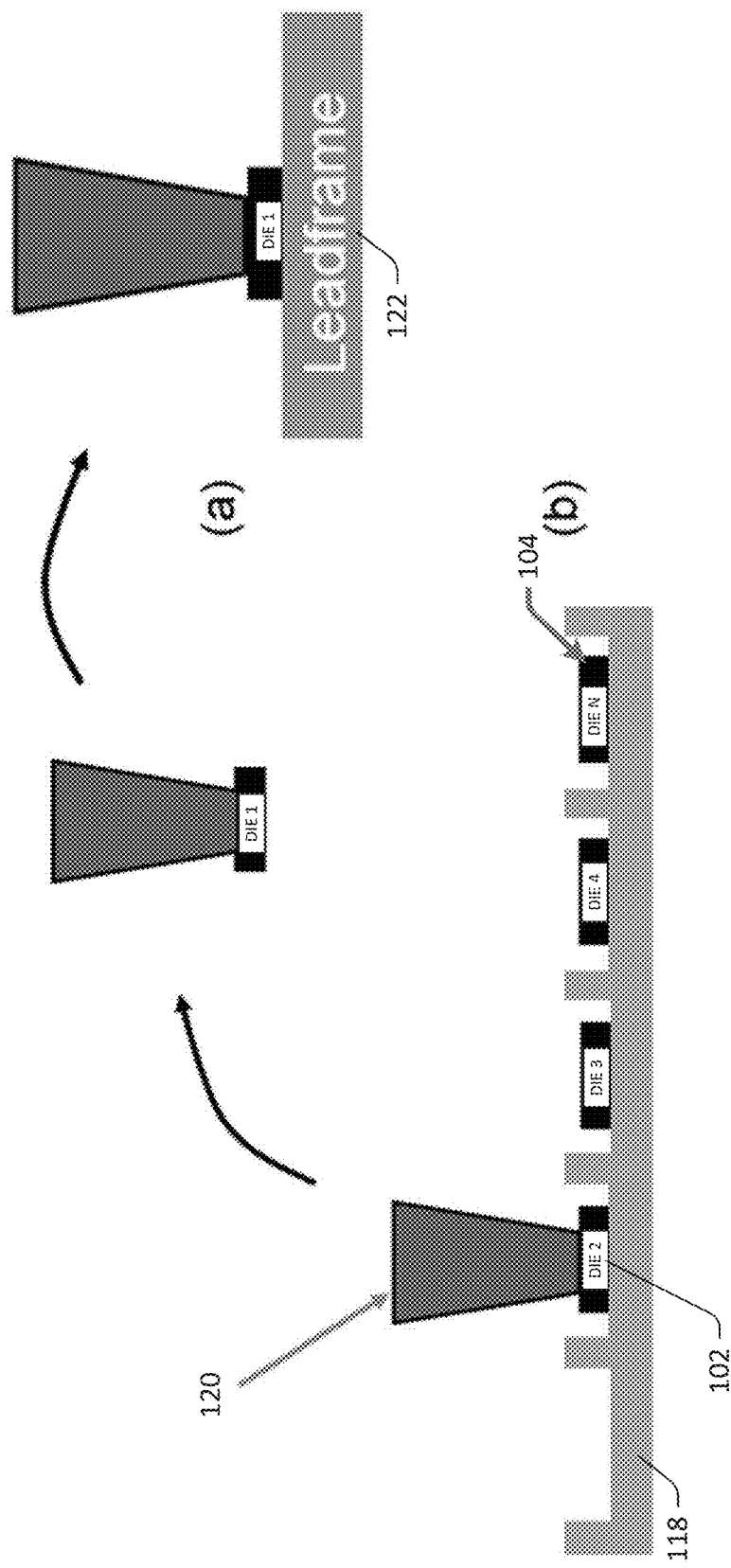
FIG. 22 depicts picking and placing the singulated encapsulated semiconductor dies from the waffle pack onto a lead frame prior to being packaged.

As will described in more detail below, FIGS. 1-19 illustrate the entire process of semiconductor die encapsulation, while FIGS. 20-22 illustrate the semiconductor dies being handled post-encapsulation to the point of being attached to a lead frame prior to packaging.

FIG. 1 depicts a plurality of semiconductor dies 102 encapsulated within an encapsulant material 104. The plurality of semiconductor dies include semiconductor dies 1 through N (N being an integer greater than or equal to 1). FIG. 1 shows the final result of the encapsulation process described herein. As such, FIG. 1 is similar to FIG. 19. Each of semiconductor dies 1 through N are ultra-small (e.g., having a length of less than 500 μm) and ultrathin (e.g., having a thickness of less than 50 μm) silicon die. The encapsulation of the semiconductor dies provides protection against damage that may occur if handled as bare semiconductor dies by standard equipment, and provide an increased footprint allowing standard equipment to handle ultra-small (e.g., less than 500 μm) and ultrathin (e.g., less than 50 μm) semiconductor die. Each of the semiconductor dies 102 in FIG. 1 are shown as being centered vertically in the encapsulant, such that $v_1$ is equal to or approximately equal to $v_2$, where $v_1$ is the distance from the top most portion of the semiconductor die 102 to the top most level of the encapsulant, and $v_2$ is the distance from the bottom most portion of the semiconductor die 102 to the bottom most portion of the encapsulant. Thus, the amount of encapsulant is the same above and below each of the semiconductor dies 102. However, the semiconductor dies 102 are not necessarily centered horizontally within the encapsulant, such that the distance between the semiconductor dies, represented by $h_1$, $h_2$, $h_3$, and $h_N$, are not necessarily equal.

Figure 2:
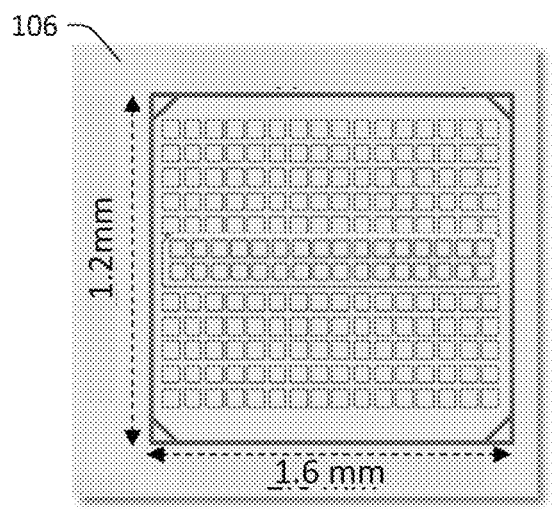
FIG. 2 depicts an example application-specific integrated circuit (ASIC) semiconductor wafer.

FIG. 2 depicts an example semiconductor wafer 106. Thin films are patterned on each semiconductor wafer 106. Furthermore, the semiconductor wafer 106 is probed and programmed to develop a map of good semiconductor dies. In the example shown in FIG. 2, the semiconductor wafer is about 1.2 mm long by 1.6 mm wide.

Figure 3:
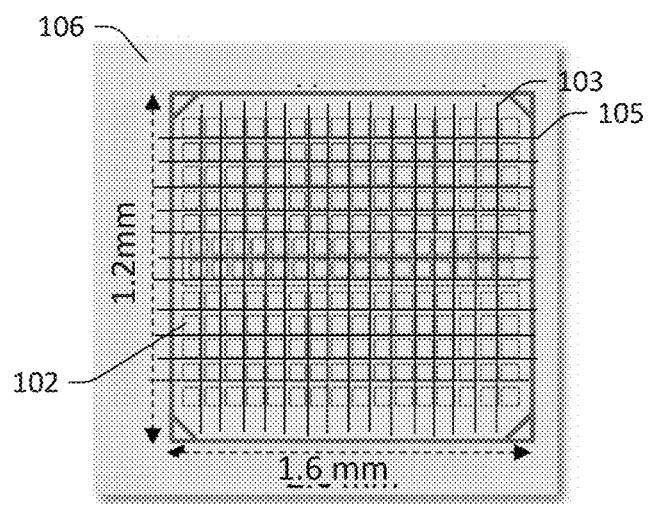
FIG. 3 depicts the example ASIC of FIG. 2 having been diced into a plurality of semiconductor dies with scribe lines.

FIG. 3 depicts the example wafer of FIG. 2 having been diced into a plurality of semiconductor dies with partially cut scribe lines. In the example shown in FIG. 3, one-hundred ninety-two (192) 100 μm by 100 μm semiconductor dies are created by scribing 15 verticals partially cut scribe lines 103 equally spaced apart as well as scribing 11 horizontal partially cut scribe lines 105 equally spaced apart. In some examples, neither the vertical or horizontal scribe lines are equally spaced apart. After scribing the lines, the backside of the cut semiconductor wafer 106 is grinded to singulate the plurality of semiconductor dies 102. The front side of the semiconductor wafer 106, having partially cut scribe lines that separate the plurality of semiconductor dies, is then placed onto a backside of dicing tape. In some examples, the number of lines that are scribed is such that resulting semiconductor dies are of a size such that stiction forces associated with handling of the semiconductor dies equal or exceed gravity making it difficult to release semiconductor dies from the pick-and-place tool. The encapsulation process creates a packaged semiconductor die where the stiction forces are less than gravity.

FIG. 4 depicts the singulated 100 μm by 100 μm semiconductor dies 102 placed onto the backside of the dicing tape 108. The dicing tape used for the process should be highly stretchable, such as being able to stretch up to 5 times its original length. After the semiconductor dies 102 are placed onto the backside of the dicing tape 108, the singulated semiconductor dies are thinned to a thickness (e.g., 50 μm) that results in a final form factor for the semiconductor dies 102 while the semiconductor dies 102 are mounted on the dicing tape 108.

FIG. 5 depicts an example application of ultraviolet (UV) light 111 to the dicing tape 108 from the semiconductor die side. Once the semiconductor dies 102 have been singulated into their final form factor and while the semiconductor dies 102 are still mounted to the dicing tape 108, the dicing tape 108 is stretched 115 significantly in order to increase the space between the semiconductor dies 102. Part of the stretching process is exposing the dicing tape 108 to UV light 111 from the semiconductor die side to soften the dicing tape 108 between each of the plurality of semiconductor dies 102. The UV light 111 softens the dicing tape 108 in between the semiconductor dies 102. The portion of the dicing tape 108 under the semiconductor dies 102 is not affected. This enables stretching of the dicing tape 108 only in the areas in between the semiconductor dies 102. The semiconductor dies 102 stay affixed to the portion of the dicing tape 108 that has not been softened. The portion of the dicing tape 108 that has not been softened resists stretching. This enables uniform stretching of the dicing tape 108 without loosening of the semiconductor dies 102 from the dicing tape 108 during stretching. The dicing tape 108 may be stretched using any number of means, including using a matrix expander or by using a piston-fixture apparatus such as the piston-fixture apparatus shown in FIG. 6. In some examples, application of the UV light 111 and stretching 115 is repeated several times until the dicing tape 108 is stretched to a desired length. Multiple stretching is only done in examples where the range of a stretching tool used for stretching is less than the amount needed to stretch. In such examples, stretching is done multiple times until the desired separation between semiconductor dies 102 is achieved.

Figure 6:
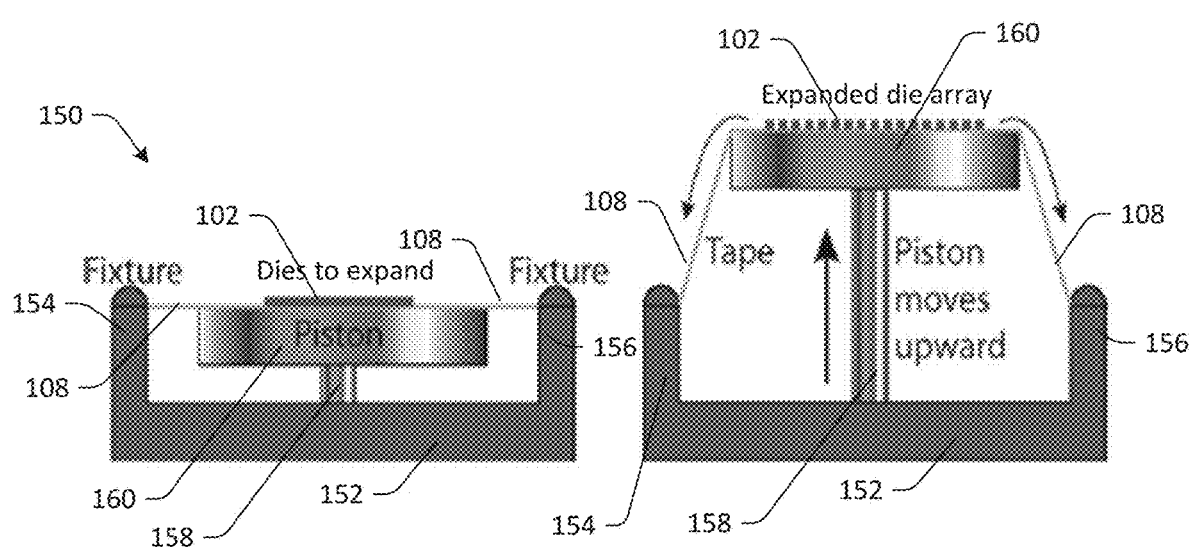
FIG. 6 is an example apparatus used to stretch the dicing tape having a plurality of semiconductor dies.

FIG. 6 is an example apparatus 150 used to stretch the dicing tape 108 having the plurality of semiconductor dies 102. The apparatus 150 includes a fixture having a support base 152, a first end 154 and second end 156, and a piston 160 that moves upward via a trunk 158. The piston 160 is moved upward using a motor, or any other mechanical means. The dicing tape 108 is stretched to result in an expanded semiconductor die array by attaching a first end of the dicing tape 108 to the first end 154 of the fixture, attaching a second end of the dicing tape 108 to the second end 156 of the fixture, attaching the portion of the dicing tape 108 having the plurality of semiconductor dies 102 to the piston 160, and moving the piston 160 upward to expand the array of semiconductor dies 102 and stretch the dicing tape 108 to increase the distance between the plurality of semiconductor dies 102.

FIG. 7 shows an example planar surface 175 used for the encapsulation process. Creation of the planar surface 175 is the first stage of the encapsulation process. Also, the encapsulation process occurs under a vacuum. For ultra-small, ultra-thin semiconductor die, the lamination/encapsulation process should occur in a low-pressure environment otherwise voiding around the semiconductor dies is typical. Voiding increases the likelihood that the two layers of lamination will separate from one another.

The planar surface 175 includes a sacrificial substrate 114, an anti-adhesion layer 112, and material 110 added where the anti-adhesion layer 112 was not applied to create the planar surface. The sacrificial substrate 114 serves as a flat stage, or rigid substrate, to support the dicing tape during the encapsulation process. The anti-adhesion layer 112 is applied so that when the encapsulated semiconductor dies are removed from the planar surface 175, the encapsulant material is not damaged.

FIG. 8 shows a first layer 107 of encapsulant material being applied to the planar surface via a first film layer 119. The first film layer 119 is an application means to apply to the first layer 107 of encapsulant material. The first film layer 119 as well as the first layer 107 of encapsulant material are supported by the planar surface 175 comprising the sacrificial substrate 114, anti-adhesion layer 112 and added material 110.

Figure 9:
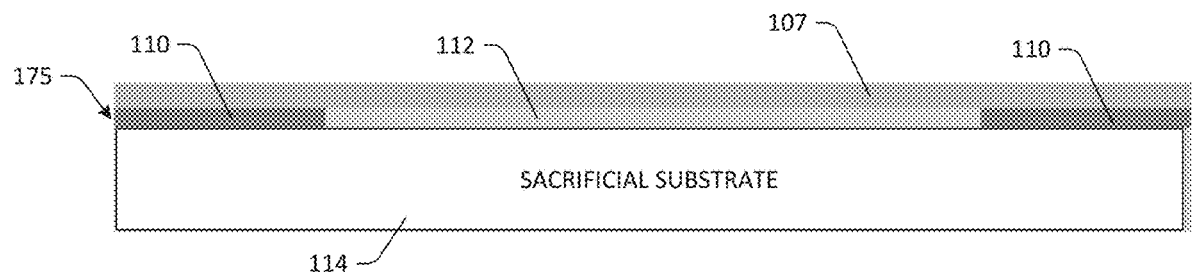
FIG. 9 depicts the first layer of encapsulant material residing on the planar surface after the first film layer has been removed.

FIG. 9 depicts the first layer 107 of encapsulant material residing on the planar surface 175 after the first film layer 119 has been removed. The first layer 107 of encapsulant material has been applied, and thus the dicing tape 108 having the plurality of semiconductor dies 102 can be added to the first layer 107 of encapsulant material. However, prior to lamination, the dicing tape is treated to reduce the adhesive properties of exposed surfaces of the dicing tape 108.

Figure 10:
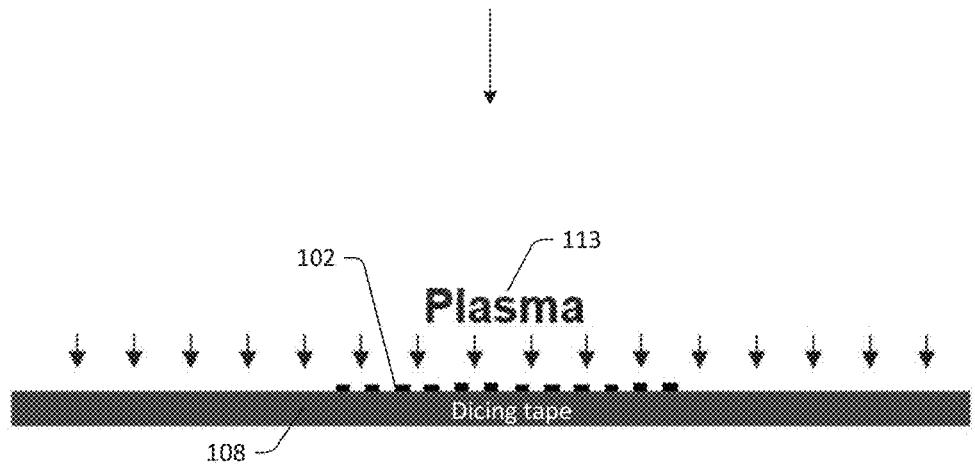
FIG. 10 depicts plasma being applied to the dicing tape having a plurality of semiconductor dies.

FIG. 10 depicts plasma 113 being applied to the dicing tape 108 having the plurality of semiconductor dies 102. The plasma 113 is applied to the dicing tape 108 to reduce the tackiness (e.g., the adhesive properties) of the dicing tape 108. In some examples, the plasma 113 is oxygen. More specifically, the plasma 113 etch reduces adhesion of the surface of the dicing tape 108 by removing some of the tacky polymer surface, allowing the dicing tape 108 to come into contact with the encapsulant material during lamination and transfer and then separate from the encapsulant material without damaging the encapsulant material.

FIG. 11 depicts placement of the dicing tape 108 having the plurality of semiconductor dies 102 onto the first layer 107 of encapsulant material. The dicing tape 108 is applied to the first layer 107 of encapsulant material such that the backside and sides of each of the plurality of semiconductor dies 102 are laminated, or embedded within the first layer 107 of encapsulant material. FIG. 12 depicts the backside and sides of each of the plurality of semiconductor dies 102 within the first layer 107 of encapsulant material after the dicing tape 108 has been applied as shown in FIG. 11.

Figure 13:
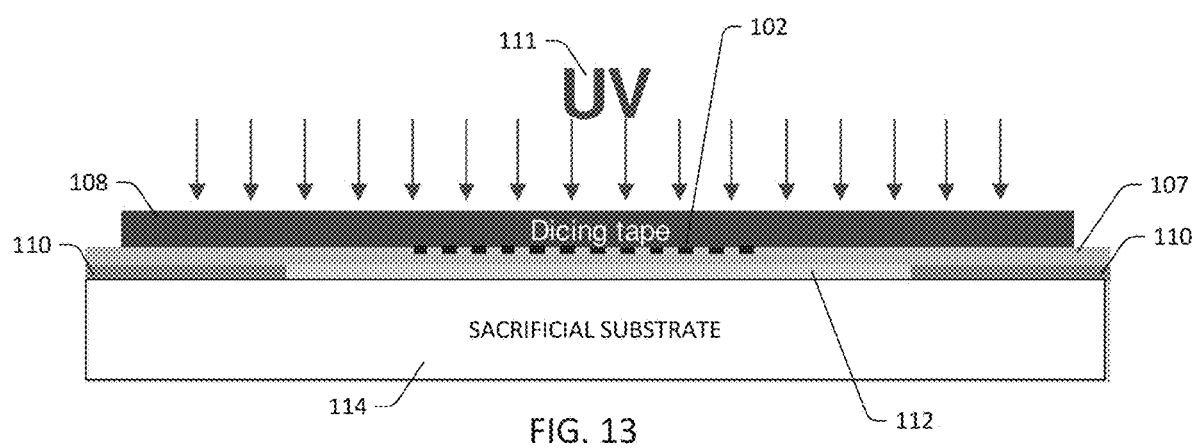
FIG. 13 depicts exposing a front side of the dicing tape to UV light to release the dicing tape from the plurality of semiconductor dies.

FIG. 13 depicts exposing a front side of the dicing tape 108 to UV light 111 to release the dicing tape 108 from the plurality of semiconductor dies 102. Once the dicing tape 108 and first layer 107 of encapsulant material have come together, the front side of the dicing tape is exposed to the UV light 111 in order to release the semiconductor dies 102 from the surface of the dicing tape 108 so separation of the dicing tape 108 and the first layer 107 of encapsulant material does not cause the semiconductor dies 102 to be removed out of the first layer 107 of encapsulant material.

Figure 14:
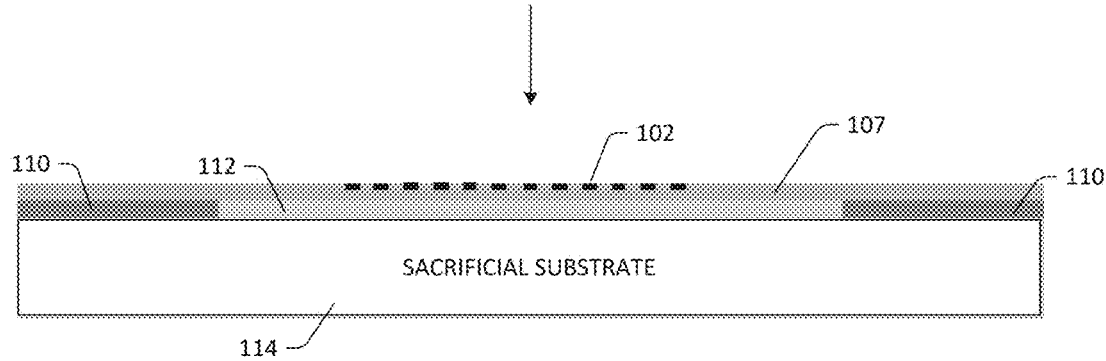
FIG. 14 depicts the backsides and sides of the semiconductor dies embedded within the first layer of encapsulant material after the dicing tape has been removed.

FIG. 14 depicts the backsides and sides of the semiconductor dies 102 embedded within the first layer 107 of encapsulant material after the dicing tape 108 has been removed. In some examples, the dicing tape 108 is removed by peeling or a variety of other mechanical means.

Figure 15:
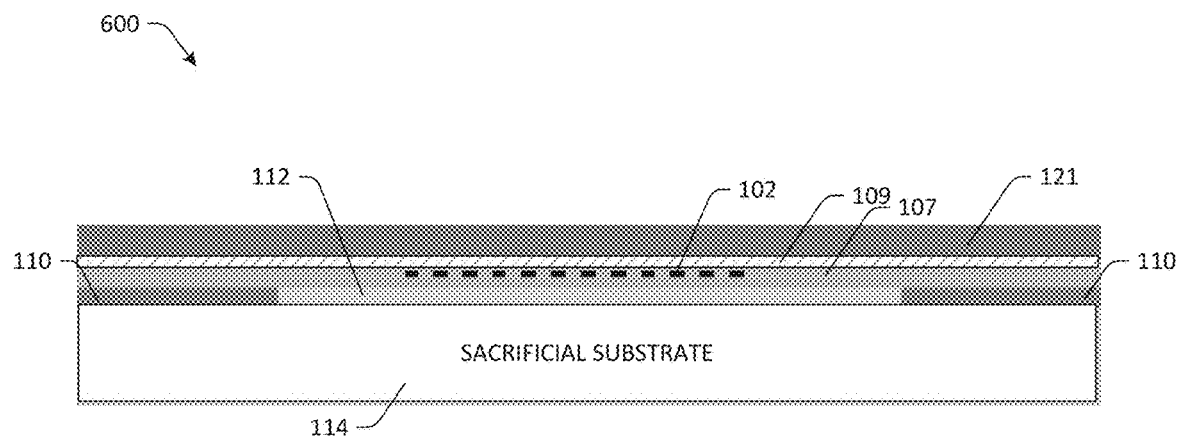
FIG. 15 depicts application of a second layer of encapsulant material to laminate a front side of the plurality of semiconductor dies via a second film layer.

FIG. 15 depicts application of a second layer 109 of encapsulant material to laminate a front side of the plurality of semiconductor dies 102 using a second film layer 121. A second lamination process is executed while the semiconductor dies 102 are still on the sacrificial substrate 114. The second lamination process accumulates an additional layer of encapsulant material, namely the second layer 109 of encapsulant material, to the exposed surfaces of the semiconductor dies 102. Various types of material for the second film layer 121 can be used, such as dry-film.

Figure 16:
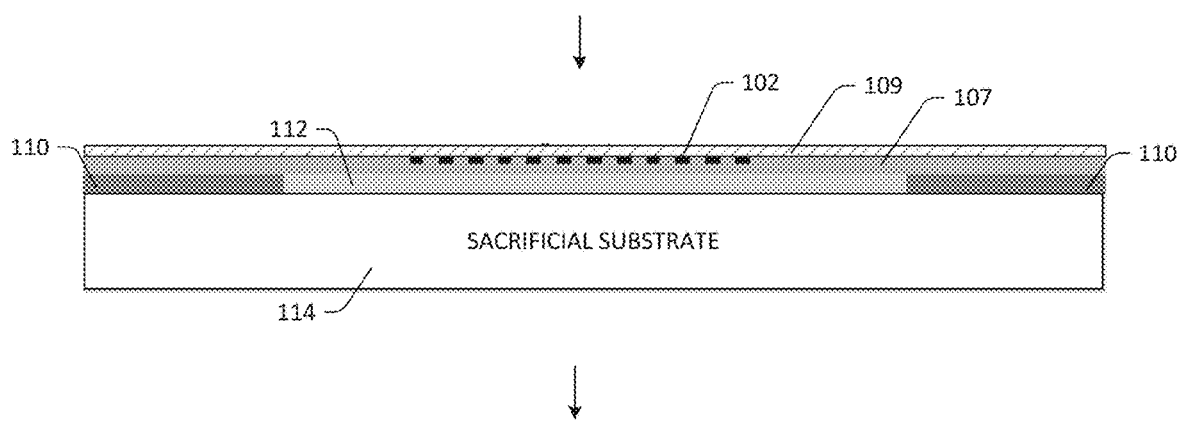
FIG. 16 depicts the semiconductor dies embedded within the first layer of encapsulant material and second layer of encapsulant material after the second film layer has been removed.

FIG. 16 depicts the semiconductor dies 102 embedded within the first layer 107 of encapsulant material and the second layer 109 of encapsulant material after the second film layer 121 has been removed. After the second film layer 121 has been removed, the semiconductor dies are fully encapsulated between the first layer 107 of encapsulant material and the second layer 109 of encapsulant material.

Figure 17:
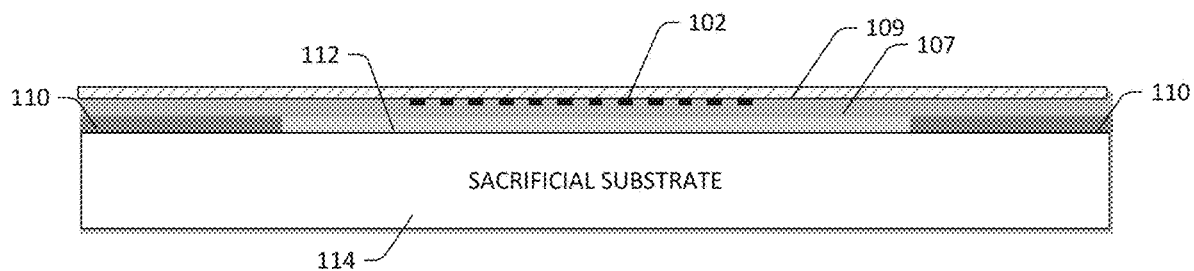
FIG. 17 depicts curing of the encapsulated semiconductor dies.

FIG. 17 depicts the encapsulated semiconductor dies 102 while the encapsulated semiconductor dies 102 are being cured. Once the semiconductor dies 102 are fully embedded in the two layers of encapsulant material, the full stack is cured. In some examples, the encapsulated semiconductor dies 102 are cured at approximately 160 degrees Celsius for about one hour. Curing the encapsulant material gives the stack a high level of mechanical strength.

Figure 18:
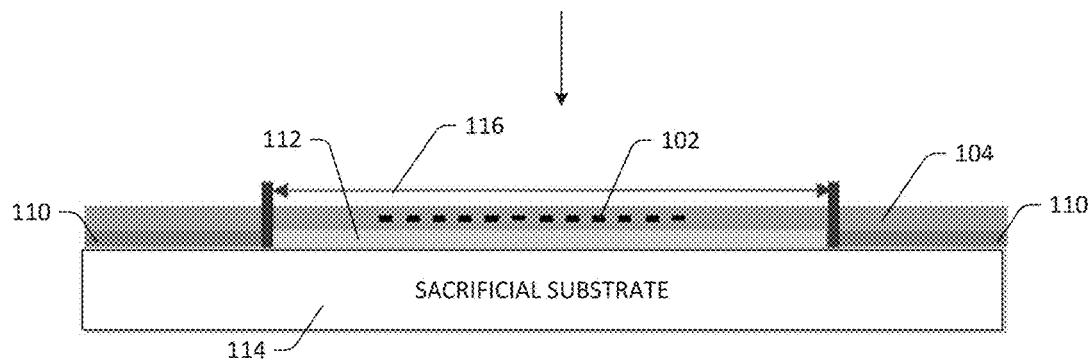
FIG. 18 depicts cutting out a cured sheet of encapsulated semiconductor dies.

FIG. 18 depicts cutting out a cured sheet 116 of encapsulated semiconductor dies. In the example shown in FIG. 18, the cured sheet 116 is cut such that the cured sheet 116 has a length the size of the length of the anti-adhesion layer 112 so that the cured sheet 116 does not stick to the sacrificial substrate 114.

FIG. 19 depicts the cut out cured sheet of semiconductor dies 102 that have been encapsulated into the encapsulant material 104. FIG. 19 is equivalent to FIG. 1, as FIG. 1 and FIG. 19 show the fully encapsulated, cured semiconductor dies that is the result of the lamination process. The fully cured sheet is flexible and mechanically robust, such that the sheet withstands subsequent dicing and handling, and allows for use of standard pick and place equipment. Each of the semiconductor dies 102 in FIG. 19 are shown as being centered vertically in the encapsulant material, such that $v_1$ is equal to or approximately equal to $v_2$, where $v_1$ is the distance from the top most portion of the semiconductor die 102 to the top most level of the encapsulant, and $v_2$ is the distance from the bottom most portion of the semiconductor die 102 to the bottom most portion of the encapsulant. Thus, the amount of encapsulant is the same or substantially the same above and below each of the semiconductor dies 102. However, the semiconductor dies 102 are not necessarily centered horizontally within the encapsulant, such that the distance between the semiconductor dies, represented by $h_1$, $h_2$, $h_3$, and $h_N$, are not necessarily equal or substantially equal.

FIG. 20 depicts the encapsulated semiconductor dies 102 after the semiconductor dies 102 have been singulated. In some examples, the encapsulated semiconductor dies 102 are singulated into 200 µm by 200 µm semiconductor dies. For example, if the original semiconductor dies were of a size 100 µm by 100 µm by 20 µm prior to encapsulation, the semiconductor dies are singulated such that they now located in a 200 µm by 200 µm by 40 µm encapsulant material with 10 µm of encapsulant material covering the top and bottom of the semiconductor die. In some examples, the semiconductor dies are singulated using a laser and/or a saw. In one example, while the singulated semiconductor dies 102 are on the dicing tape, they are interrogated to determine whether or not they are functioning properly (e.g., good or bad). Alternatively, the singulated semiconductor dies 102 are placed in a vibratory hopper, sorted, put on a stage, and then interrogated to determine if they are functioning properly. The known good semiconductor dies are then transferred from the dicing tape stage to a tape-and-reel using bulk feeders and chip shooters. In yet another alternative, the semiconductor dies are interrogated after having been placed onto a tape-and-reel. As the semiconductor dies shown in FIG. 20 are the singulated semiconductor dies from the cured sheet shown in FIG. 19, each of the semiconductor dies 102 in FIG. 20 are shown as being centered vertically in the encapsulant, such that $v_1$ equals or approximately equals $v_2$, where $v_1$ is the distance from the top most portion of the semiconductor die 102 to the top most level of the encapsulant, and $v_2$ is the distance from the bottom most portion of the semiconductor die 102 to the bottom most portion of the encapsulant. Thus, the amount of encapsulant is the same or substantially the same above and below each of the semiconductor dies 102. However, the semiconductor dies 102 are not necessarily centered horizontally within the encapsulant after being singulated, such that the distance $h_1$, representing the distance between the left most portion of a semiconductor die and the left most portion of the encapsulant does not necessarily equal the distance $h_2$, (or does not approximately equal the distance $h_2$), wherein $h_2$ represents the distance between the right most portion of a semiconductor die and the right most portion of the encapsulant.

FIG. 21 depicts the singulated encapsulated semiconductor dies placed onto a waffle pack 118. In yet another alternative, the singulated encapsulated semiconductor dies 102 can be interrogated while on the waffle pack to determine if they are still functioning properly. The spaces 123 of the waffle pack should be long enough to accommodate the singulated encapsulated semiconductor dies 102. In the example shown in FIG. 21, the spaces 123 of the waffle pack are greater than 200 µm.

FIG. 22 depicts picking and placing the singulated encapsulated semiconductor dies 102 from the waffle pack 118 onto a lead frame prior to being packaged. The semiconductor dies 102 are transferred from the waffle pack 118 (or tape-and-reel) to the lead frame using a pick and place tool nozzle 120 or any existing surface mount assembly tools or automated equipment. Only the properly functioning semiconductor dies 102 are transferred to the lead frame 122.

In some examples, the processes post-encapsulation is automated. That is, a process of automation picks and places the singulated encapsulated semiconductor dies onto a waffle pack, tape-and-reel, or vibratory hopper, interrogates the singulated semiconductor dies to determine if the singulated semiconductor dies are functioning properly, and/or transfers the properly functioning semiconductor dies from the cured sheet, waffle pack, tape-and-reel, or vibratory hopper onto a respective lead frame.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method of encapsulating integrated circuits, the method comprising:
   placing a front side of a semiconductor wafer, having partially cut scribe lines that separate a plurality of semiconductor dies, onto a backside of a dicing tape;
   grinding a backside of the cut semiconductor wafer to singulate the plurality of semiconductor dies;
   exposing the backside of the dicing tape to ultraviolet (UV) light to soften the dicing tape between each of the plurality of semiconductor dies and stretching the dicing tape to increase a distance between the plurality of semiconductor dies;

laminating a backside and sides of each of the plurality of semiconductor dies with a first layer of encapsulant material;

exposing a front side of the dicing tape to UV light to release the dicing tape from the plurality of semiconductor dies; and laminating a front side of the plurality of semiconductor dies with a second layer of encapsulant material.

2. The method of claim 1, further comprising:

curing the first layer of encapsulant material and the second layer of encapsulant material that encapsulate the plurality of semiconductor dies; and cutting the encapsulated plurality of semiconductor dies to singulate the semiconductor dies.

3. The method of claim 2, further comprising an automation comprising:

picking and placing the singulated semiconductor dies onto a waffle pack or tape-and-reel;

interrogating the singulated semiconductor dies to determine if the singulated semiconductor dies are functioning properly; and transferring the properly functioning semiconductor dies from the waffle pack or tape-and-reel onto a respective lead frame.

4. The method of claim 1, further comprising exposing the dicing tape to plasma to reduce tackiness of the dicing tape prior to laminating a backside and sides of each of the plurality of semiconductor dies with the first layer of encapsulant material so that the dicing tape will not adhere to the first layer of encapsulant material when the dicing tape is released from the plurality of semiconductor dies.

5. The method of claim 1, wherein the exposing and laminating are performed under a vacuum.

6. The method of claim 1, wherein the dicing tape is stretched by a method comprising:

attaching a first end of the dicing tape to a first end of a fixture;

attaching a second end of the dicing tape to a second end of the fixture;

attaching a portion of the dicing tape having the plurality of semiconductor dies to a piston; and moving the piston upward to expand the semiconductor dies into an array and stretch the dicing tape to increase the distance between the plurality of semiconductor dies.

7. The method of claim 1, wherein the dicing tape is stretched by a matrix expander.

8. The method of claim 1, wherein the semiconductor dies are of a size such that stiction forces associated with the semiconductor dies are greater than or equal to gravity.

9. The method of claim 1, wherein the encapsulant material is epoxy resin, a B-staged reflowable polymer adhesive, or thermoplastic.

10. A method of encapsulating integrated circuits, the method comprising:

providing a sacrificial substrate to support a layer of a dicing tape having a plurality of semiconductor dies on a backside of the dicing tape;

applying an anti-adhesion layer to a portion of the sacrificial substrate to prevent the semiconductor dies from adhering to the sacrificial substrate;

adding material to areas of the sacrificial substrate where the anti-adhesion layer was not applied to create a planar surface;

exposing the backside of the dicing tape to ultraviolet (UV) light to soften the dicing tape between each of the plurality of semiconductor dies, and stretching the dicing tape to increase a distance between the plurality of semiconductor dies;

applying a first layer of encapsulant material to the planar surface;

placing the backside of the dicing tape having the plurality of semiconductor dies onto the first layer of encapsulant material such that backsides and sides of the semiconductor dies are embedded into the first layer of encapsulant material;

exposing a front side of the dicing tape to ultraviolet light to release the dicing tape from the plurality of semiconductor dies; and applying a second layer of encapsulant material onto front sides of the semiconductor dies to encapsulate the semiconductor dies between the first layer of encapsulant material and the second layer of encapsulant material.

11. The method of claim 10, further comprising:

curing the first layer of encapsulant material and the second layer of encapsulant material that encapsulate the plurality of semiconductor dies;

removing the encapsulated plurality of semiconductor dies from the sacrificial substrate; and cutting the encapsulated plurality of semiconductor dies to singulate the semiconductor dies.

12. The method of claim 11, further comprising an automation comprising:

picking and placing the singulated semiconductor dies onto a waffle pack or tape-and-reel;

interrogating the singulated semiconductor dies to determine if the singulated semiconductor dies are functioning properly; and transferring the properly functioning semiconductor dies from the waffle pack or tape-and-reel onto a respective lead frame.

13. The method of claim 10, further comprising exposing the dicing tape to plasma to reduce tackiness of the dicing tape prior to laminating a backside and sides of each of the plurality of semiconductor dies with the first layer of encapsulant material so that the dicing tape will not adhere to the first layer of encapsulant material when the dicing tape is released from the plurality of semiconductor dies.

14. The method of claim 13, wherein the plasma is oxygen.

15. The method of claim 10, wherein the encapsulating of the semiconductor dies is performed under a vacuum.

16. The method of claim 10, wherein the dicing tape is stretched by a method comprising:

attaching a first end of the dicing tape to a first end of a fixture;

attaching a second end of the dicing tape to a second end of the fixture;

attaching a portion of the dicing tape having the plurality of semiconductor dies to a piston; and moving the piston upward to expand the semiconductor dies into an array and stretch the dicing tape to increase the distance between the plurality of semiconductor dies.

17. The method of claim 10, wherein the dicing tape is stretched by a matrix expander.

18. The method of claim 10, wherein the encapsulant material is epoxy resin, a B-staged reflowable polymer adhesive, or thermoplastic.

19. The method of claim 10, wherein the semiconductor dies are of a size such that stiction forces associated with the semiconductor dies are greater than or equal to gravity.

20. The method of claim 10, wherein the encapsulated semiconductor dies are substantially centered within the first layer of encapsulant material and the second layer of encapsulant material.

* * * * *